(12) United States Patent
Matsumoto

(10) Patent No.: US 9,437,396 B2
(45) Date of Patent: Sep. 6, 2016

(54) MULTI CHARGED PARTICLE BEAM WRITING APPARATUS, AND MULTI CHARGED PARTICLE BEAM WRITING METHOD

(71) Applicant: NuFlare Technology, Inc., Yokohama (JP)

(72) Inventor: Hironobu Matsumoto, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/755,376

(22) Filed: Jun. 30, 2015

(65) Prior Publication Data

US 2015/0303029 A1    Oct. 22, 2015

Related U.S. Application Data

(63) Continuation of application No. 14/278,177, filed on May 15, 2014, now Pat. No. 9,190,246.

(30) Foreign Application Priority Data

May 24, 2013  (JP) .................................. 2013-109839

(51) Int. Cl.
    H01J 37/20      (2006.01)
    H01J 37/24      (2006.01)
    H01J 37/317     (2006.01)
    H01J 37/04      (2006.01)
    H01J 37/30      (2006.01)

(52) U.S. Cl.
    CPC ............ *H01J 37/243* (2013.01); *H01J 37/045* (2013.01); *H01J 37/3177* (2013.01); *H01J 37/20* (2013.01); *H01J 37/3007* (2013.01); *H01J 2237/31754* (2013.01); *H01J 2237/31774* (2013.01)

(58) Field of Classification Search
    USPC ........... 250/398, 492.1, 492.2, 492.22, 492.3
    See application file for complete search history.

(56) References Cited

U.S. PATENT DOCUMENTS 6,597,001 B1    7/2003  Yamashita et al.
8,759,799 B2    6/2014  Matsumoto (Continued)

FOREIGN PATENT DOCUMENTS

JP    2006-261342    9/2006
JP    2014-60194     4/2014

OTHER PUBLICATIONS

Combined Office Action and Search Report issued Aug. 27, 2015 in Taiwanese Patent Application No. 103115357 (with English language translation).

*Primary Examiner* — Phillip A Johnston
*Assistant Examiner* — Hsien Tsai
(74) *Attorney, Agent, or Firm* — Oblon, McClelland, Maier & Neustadt, L.L.P.

(57) ABSTRACT

A multi charged particle beam writing apparatus includes a dose calculation unit to calculate a first dose resolving the resist of the target object, for a first beam of the multiple beams, corresponding to a pattern forming region, in which a pattern is arranged; and to calculate a second dose not resolving the resist, for a second beam of the multiple beams, corresponding to a no-pattern forming region, which surrounds the whole perimeter of the pattern and in which no pattern is arranged, and a deflection control unit to control a plural blankers so that a dose of the first beam is to be the first dose calculated and a dose of the second beam is to be the second dose calculated.

13 Claims, 16 Drawing Sheets

(56) References Cited

U.S. PATENT DOCUMENTS

| | | |
|---|---|---|
| 8,791,432 B2 | 7/2014 | Matsumoto |
| 2011/0253912 A1 | 10/2011 | Matsumoto |
| 2012/0001097 A1* | 1/2012 | Yashima ............. H01J 37/3174 250/492.22 |
| 2012/0068089 A1* | 3/2012 | Nakayamada ......... B82Y 10/00 250/492.22 |
| 2012/0085940 A1 | 4/2012 | Matsumoto |
| 2013/0056647 A1* | 3/2013 | Yoshikawa ......... H01J 37/3026 250/400 |
| 2014/0077103 A1 | 3/2014 | Matsumoto |

* cited by examiner

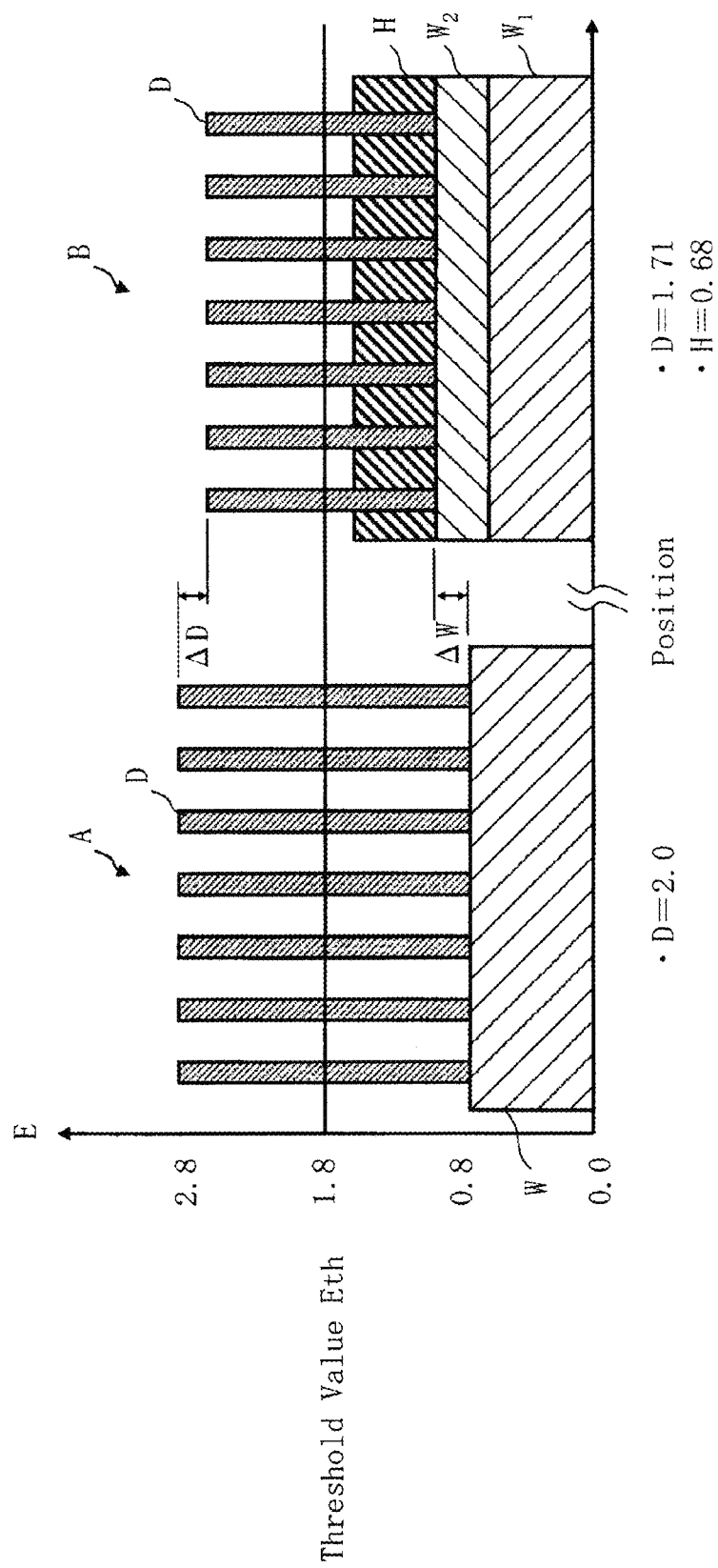

MULTI CHARGED PARTICLE BEAM WRITING APPARATUS, AND MULTI CHARGED PARTICLE BEAM WRITING METHOD

CROSS-REFERENCE TO RELATED APPLICATION

This application is a continuation of U.S. application Ser. No. 14/278,177, filed May 15, 2014 which claims the benefit of priority from the prior Japanese Patent Application No. 2013-109839 filed on May 24, 2013 in Japan, the entire contents of which are incorporated herein by reference.

BACKGROUND OF THE INVENTION

1. Field of the Invention

The present invention relates to a multi charged particle beam writing apparatus and a multi charged particle beam writing method. More specifically, for example, the present invention relates to a method for reducing the time of writing with multiple beams.

2. Description of Related Art

The lithography technique that advances miniaturization of semiconductor devices is extremely important as being a unique process whereby patterns are formed in the semiconductor manufacturing. In recent years, with high integration of LSI, the line width (critical dimension) required for semiconductor device circuits is decreasing year by year. The electron beam (EB) writing technique, which intrinsically has excellent resolution, is used for writing or "drawing" a pattern on a wafer and the like with electron beams.

In a variable shaped beam (VSB) type electron beam writing that uses a single electron beam for writing, the more patterns become complicated, the more it becomes necessary to divide patterns into fine shot figures, so that the writing time becomes long. In order to solve this problem, it could be thought to shorten the writing time by increasing a beam current density so as to compensate the increase in the number of shots. However, if this method is employed, since the influence of resist heating and the like becomes large, there is a limit also to this method.

Now, think of a writing apparatus using multiple beams (multi-beams). Compared with the case of writing a pattern by using a single electron beam, since it is possible to emit multiple beams at a time in multiple writing, the throughput can be greatly increased. In a writing apparatus employing a multi-beam system, for example, multiple beams are formed by letting an electron beam emitted from an electron gun assembly pass through a mask with a plurality of holes arranged in a matrix, blanking control is performed for each of the multiple beams, and each unblocked beam is deflected by a deflector to irradiate a desired position on a target object or "sample" (refer to, e.g., Japanese Patent Application Laid-open (JP-A) No. 2006-261342). In the writing apparatus of this multi-beam system, since a plurality of beams are emitted at a time, the influence of pattern shapes on the writing time is small compared with a variable shaped beam system.

The writing time is affected not only by a pattern shape but also by a pattern density, for example. In the variable shaped beam type electron beam writing described above, it is sufficient to emit beams only to a point where a pattern exists. In other words, it is sufficient to pass through a point where a pattern does not exist, without emitting beams. Therefore, the writing time is short in the case of layout with low pattern density. By contrast, the writing time is long in the case of layout with high pattern density. On the other hand, in the multi-beam writing, it is thought that since a plurality of beams are emitted at a time, the higher the layout pattern density is, the shorter the writing time becomes compared with the variable shaped beam type electron beam writing. However, the lower the layout pattern density is, the larger the dose needed for exposure becomes. Therefore, consequently, in the multi-beam writing, the lower the layout pattern density on the whole is, the longer the writing time becomes compared with the case of high layout pattern density on the whole. For example, when writing the layout of a line and space pattern whose pattern density is 10% with multiple beams, it needs 1.5 times the writing time of writing the layout of a line and space pattern whose pattern density is 50% with multiple beams. Accordingly, in the multi-beam writing, it is requested to further reduce the writing time. Particularly, reducing the writing time while mitigating the influence of a pattern density is requested.

BRIEF SUMMARY OF THE INVENTION

In accordance with one aspect of the present invention, a multi charged particle beam writing apparatus includes a stage configured to mount a target object with applied resist and to be continuously movable; an emission unit configured to emit a charged particle beam; an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings; a plurality of blankers configured to respectively perform blanking deflection of a corresponding beam in the multiple beams having passed through the plurality of openings of the aperture member; a blanking aperture member configured to block each beam having been deflected to be in a beam-off state by the plurality of blankers; a dose calculation unit configured to calculate a first dose that resolves the resist, for a first beam of the multiple beams which is corresponding to a pattern forming region, in which a figure pattern is arranged, and to calculate a second dose that does not resolve the resist, for a second beam of the multiple beams which is corresponding to a no-pattern forming region, which surrounds a whole perimeter of the figure pattern and in which no figure pattern is arranged; and a deflection control unit configured to control the plurality of blankers so that a dose of the first beam of the multiple beams is to be the first dose calculated and a dose of the second beam of the multiple beams is to be the second dose calculated.

Moreover, in accordance with another aspect of the present invention, a multi charged particle beam writing method includes calculating a first dose that resolves resist, for a beam of multiple beams which is corresponding to a pattern forming region, in which a figure pattern is arranged, wherein the multiple beams are formed by letting portions of a charged particle beam respectively pass through a corresponding opening of a plurality of openings, and calculating a second dose that does not resolve the resist, for a beam of the multiple beams which is corresponding to a no-pattern forming region, which surrounds a whole perimeter of the figure pattern and in which no figure pattern is arranged; and writing the pattern forming region, in which the figure pattern is arranged, by using a beam with the first dose of the multiple beams, and writing the no-pattern forming region, which surrounds the whole perimeter of the figure pattern and in which no figure pattern is arranged, by using a beam with the second dose of the multiple beams.

BRIEF DESCRIPTION OF THE DRAWINGS

FIGS. 5A of a comparative example and 5B of the first embodiment each show an incident dose of a line and space pattern whose pattern density is 50%;

DETAILED DESCRIPTION OF THE INVENTION

In the following embodiments, there will be described a writing apparatus and method that can reduce the writing time of the multi-beam writing system.

In the following embodiments, there will be described a configuration in which an electron beam is used as an example of a charged particle beam. The charged particle beam is not limited to the electron beam, and other charged particle beam such as an ion beam may also be used.

First Embodiment

Figure 1:
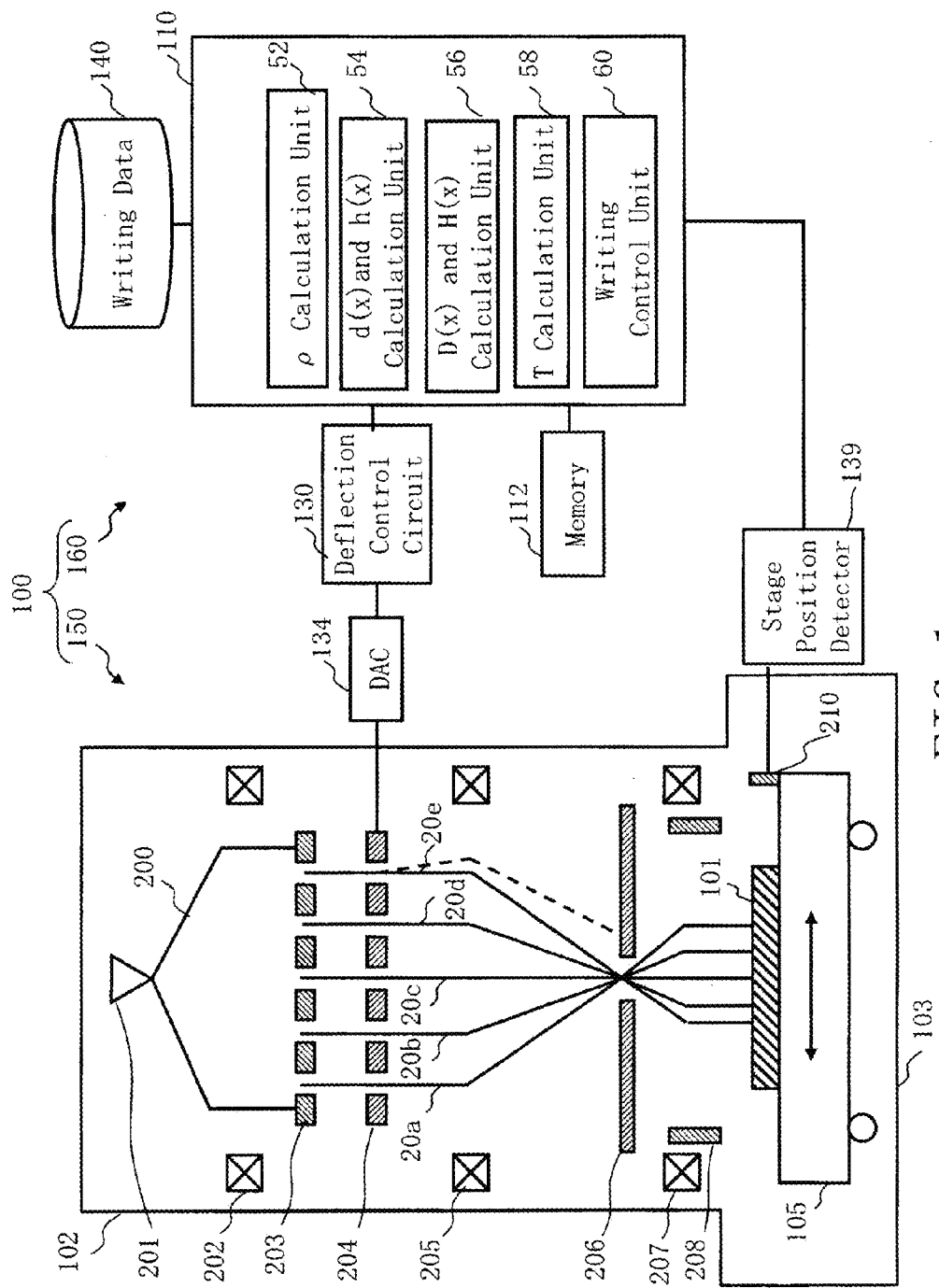
FIG. 1 is a schematic diagram showing a configuration of a writing apparatus according to the first embodiment.

FIG. 1 is a schematic diagram showing a configuration of a writing apparatus according to the first embodiment. As shown in FIG. 1, a writing (or "drawing") apparatus 100 includes a writing unit 150 and a control unit 160. The writing apparatus 100 is an example of a multi charged particle beam writing apparatus. The writing unit 150 includes an electron optical column 102 and a writing chamber 103. In the electron optical column 102, there are arranged an electron gun assembly 201, an illumination lens 202, an aperture member 203, a blanking plate 204, a reducing lens 205, a limiting aperture member 206, an objective lens 207, and a deflector 208. In the writing chamber 103, there is arranged an XY stage 105. On the XY stage 105, a target object or "sample" 101 such as a mask serving as a writing target substrate is placed when performing writing. The target object 101 is, for example, an exposure mask used for manufacturing semiconductor devices, or a semiconductor substrate (silicon wafer) on which semiconductor elements are formed. The target object 101 may be, for example, a mask blank on which resist is applied and a pattern has not yet been formed. Further, a mirror 210 for measuring a position is arranged on the XY stage 105.

The control unit 160 includes a control computer 110, a memory 112, a deflection control circuit 130, a digital/analogue converter (DAC) amplifier 134, a stage position detection unit 139, and a storage device 140 such as a magnetic disk drive. The control computer 110, the memory 112, the deflection control circuit 130, the stage position detection unit 139, and the storage device 140 are mutually connected through a bus (not shown). Writing data is input into the storage device 140 (storage unit) from the outside to be stored therein. As for the DAC amplifier 134, the deflection control circuit 130 is connected to its signal input side, and the blanking plate 204 is connected to its output side.

In the control computer 110, there are arranged a pattern density calculation unit 52, a dose coefficient calculation unit 54, a dose calculation unit 56, an irradiation time calculation unit 58, and a writing control unit 60. Each function, such as a writing data processing unit 50, the pattern density calculation unit 52, the dose coefficient calculation unit 54, the dose calculation unit 56, the irradiation time calculation unit 58, and the writing control unit 60 may be configured by hardware such as an electronic circuit or by software such as a program causing a computer to implement these functions. Alternatively, it may be configured by a combination of hardware and software. Data which is input and output to/from the writing data processing unit 50, the pattern density calculation unit 52, the dose coefficient calculation unit 54, the dose calculation unit 56, the irradiation time calculation unit 58, and the writing control unit 60 and data being calculated are stored in the memory 112 each time.

FIG. 1 shows a structure necessary for explaining the first embodiment. Other structure elements generally necessary for the writing apparatus 100 may also be included.

Figure 2A:
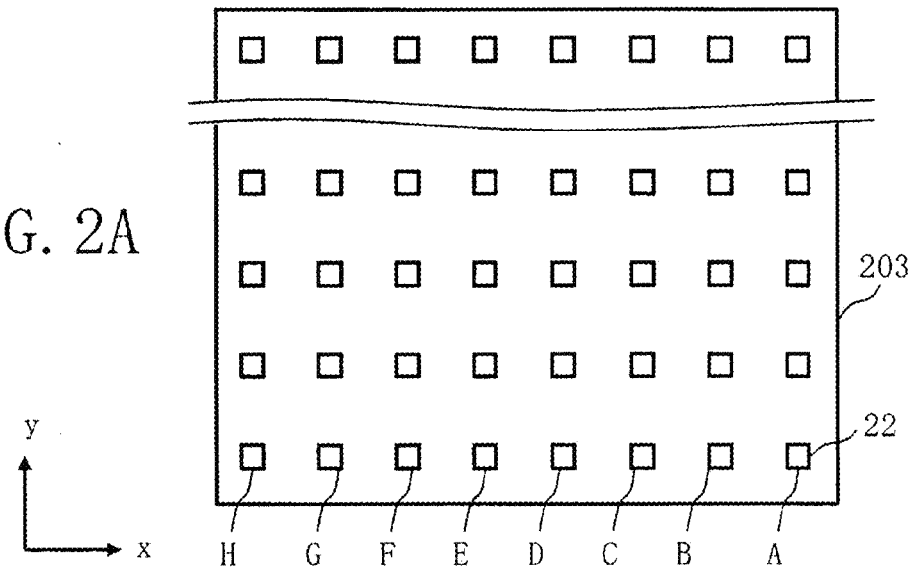
FIGS. 2A and 2B are conceptual diagrams each showing an example of the configuration of an aperture member according to the first embodiment.
Figure 2B:
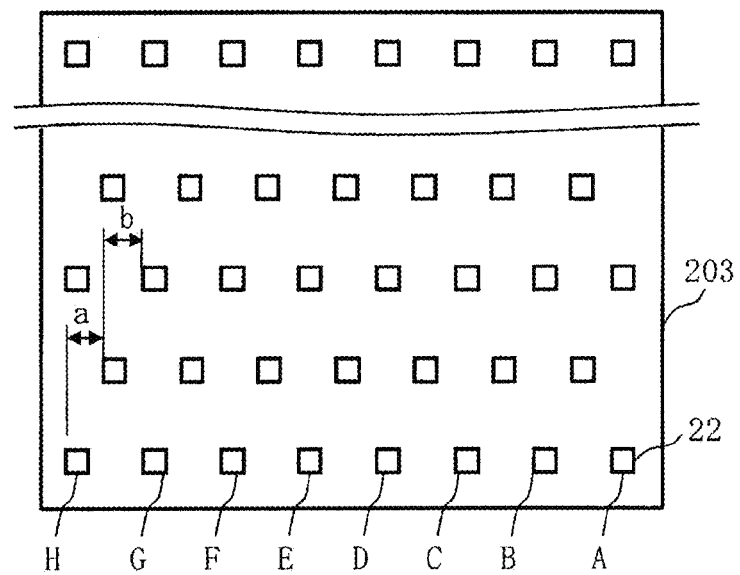

FIGS. 2A and 2B are conceptual diagrams each showing an example of the configuration of an aperture member according to the first embodiment. In FIG. 2A, holes (openings) 22 are formed at a predetermined arrangement pitch, in the shape of a matrix, in the aperture member 203, wherein m×n (m≥2, n≥2) holes 22 are arranged in m columns in the vertical direction (the y direction) and n rows in the horizontal direction (the x direction). In FIG. 2A, holes 22 of 512 (rows)×8 (columns) are formed, for example. The holes 22 are quadrangles, such as rectangles or squares, of the same dimensions and shape. Alternatively, the holes may be circles of the same circumference. In this case, there is shown an example of each row having eight holes 22 from A to H in the x direction. Multi-beams 20 are formed by letting portions of an electron beam 200 respectively pass through a corresponding hole of a plurality of holes 22. Here, there is shown the case where the holes 22 are arranged in a plurality of columns and rows in both the x and the y directions, but it is not limited thereto. For example, it is also acceptable to arrange a plurality of holes 22 in only one row or in only one column, that is, in one row where a plurality of holes are arranged as columns, or in one column where a plurality of holes are arranged as rows. Moreover, the method of arranging the holes 22 is not limited to the case of FIG. 2A where the holes are aligned in a grid. It is also preferable to arrange the holes 22 as shown in FIG. 2B where the position of each hole in the second row is shifted from the position of each hole in the first row by a dimension "a" in the horizontal direction (x direction), for example. Similarly, it is also preferable to arrange the holes 22 such that the position of each hole in the third row is shifted from the position of each hole in the second row by a dimension "b" in the horizontal direction (x direction).

Figure 3:
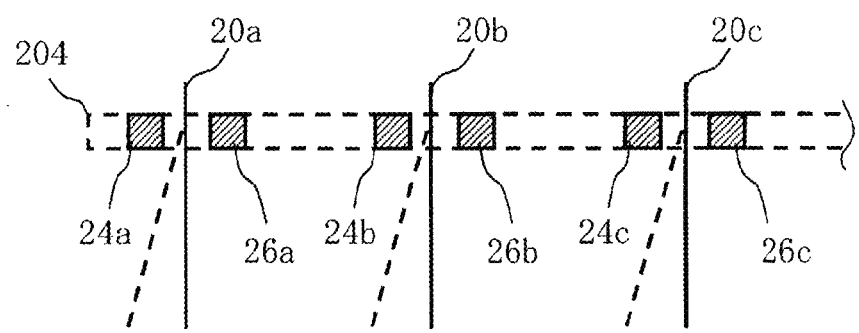
FIG. 3 is a conceptual diagram showing the configuration of a blanking plate according to the first embodiment.

FIG. 3 is a conceptual diagram showing the configuration of a blanking plate according to the first embodiment. In the blanking plate 204, a passage hole is formed to be corresponding to the arrangement position of each hole 22 of the aperture member 203, and a pair of electrodes 24 and 26 (blankers) is arranged for each passage hole. The electron beams 20 (multiple beams) respectively passing through a corresponding passage hole are respectively deflected by the voltage applied to the two electrodes 24 and 26 being a pair, and blanking control is performed by this deflection. Thus, a plurality of blankers respectively perform blanking deflection of a corresponding beam in the multiple beams having passed through a plurality of holes 22 (openings) of the aperture member 203.

The writing operation is controlled by the writing control unit 60. The electron beam 200 emitted from the electron gun assembly 201 (an emission unit) almost perpendicularly illuminates the whole of the aperture member 203 by the illumination lens 202. A plurality of holes (openings), each being a quadrangle, are formed in the aperture member 203. The region including all the plurality of holes of the aperture member 203 is irradiated by the electron beam 200. For example, a plurality of quadrangular electron beams (multiple beams) 20a to 20e are formed by letting parts of the electron beam 200 pass through a corresponding hole of the plurality of holes of the aperture member 203 respectively. The multiple beams 20a to 20e respectively pass through a corresponding blanker of the blanking plate 204. Each blanker deflects (performs blanking deflection) each electron beam 20 which respectively passes therethrough. The multiple beams 20a to 20e having passed through the blanking plate 204 are reduced by the reducing lens 205, and advance toward a hole at the center of the limiting aperture member 206. At this point, the electron beam 20 which was deflected by the blanker of the blanking plate 204 is deviated from the hole at the center of the limiting aperture member 206 (a blanking aperture member) and is blocked by the limiting aperture member 206. On the other hand, the electron beam 20 which was not deflected by the blanker of the blanking plate 204 passes through the hole at the center of the limiting aperture member 206. Blanking control is performed by on/off of the blanker so as to control on/off of the beam. Thus, the limiting aperture member 206 blocks each beam which was deflected to be in the "beam off" state by each of a plurality of blankers. Then, one shot beam of multiple beams is formed by a beam which has been formed during from the "beam on" state to the "beam off" state and has passed through the limiting aperture member 206. The multiple beams 20 having passed through the limiting aperture member 206 are focused by the objective lens 207 in order to be a pattern image of a desired reduction ratio. Then, respective beams (the entire multi-beams 20) having passed through the limiting aperture member 206 are collectively deflected in the same direction by the deflector 208 so as to irradiate respective irradiation positions on the target object 101. While the XY stage 105 is continuously moving, controlling is performed by the deflector 208 so that irradiation positions of beams may follow the movement of the XY stage 105, for example. In order to measure the position of the XY stage 105, the stage position detection unit 139 emits laser lights and receives reflected lights reflected by the mirror 210. The measured stage position is output to the writing control unit 60. Ideally, the multi-beams 20 to irradiate at a time are aligned at the pitch obtained by multiplying the arrangement pitch of a plurality of holes of the aperture member 203 by a desired reduction ratio described above. The writing apparatus 100 performs a writing operation by the raster scan method which continuously irradiates shot beams in order. When writing a desired pattern, a beam required corresponding to a pattern is controlled by blanking control to be "beam-on".

Figure 4A:
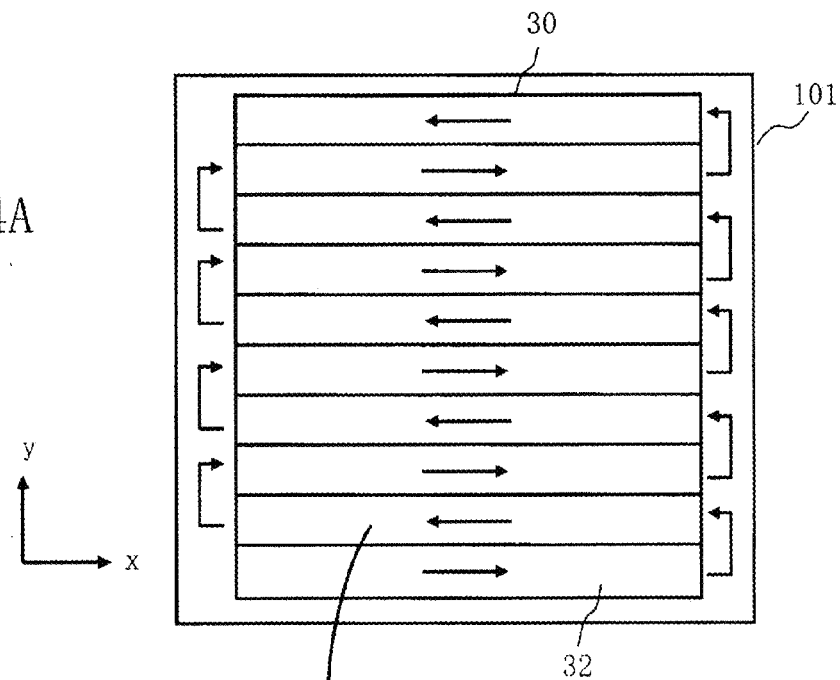
FIGS. 4A to 4C are conceptual diagrams explaining a writing operation according to the first embodiment.
Figure 4B:
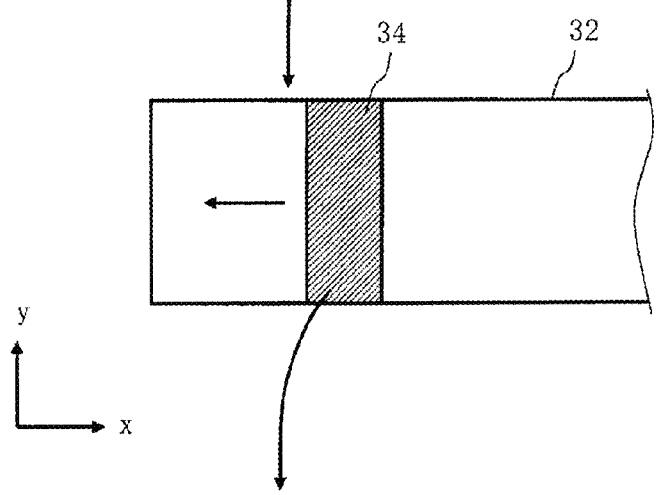
Figure 4C:
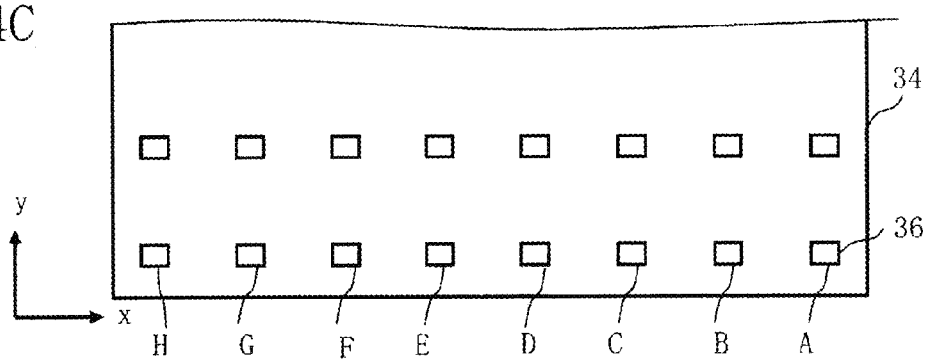

FIGS. 4A to 4C are conceptual diagrams explaining a writing operation according to the first embodiment. As shown in FIG. 4A, a writing region 30 of the target object 101 is virtually divided into a plurality of strip-shaped stripe regions 32 each having a predetermined width in the y direction, for example. Each of the stripe regions 32 serves as a writing unit region. First, the XY stage 105 is moved and adjusted such that an irradiation region 34 to be irradiated with one-time irradiation of the multi-beams 20 is located at the left end of the first stripe region 32 or at a position more left than the left end, and then writing is started. When writing the first stripe region 32, the writing advances relatively in the x direction by moving the XY stage 105 in the −x direction, for example. The XY stage 105 is continuously moved at a predetermined speed, for example. After writing the first stripe region 32, the stage position is moved in the −y direction and adjusted such that the irradiation region 34 is located at the right end of the second stripe region 32 or at a position more right than the right end to be relatively located in the y direction. Then, similarly, as shown in FIG. 4B, writing advances in the −x direction by moving the XY stage 105 in the x direction, for example. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also acceptable to perform writing in the same direction when writing each stripe region 32. By one shot, as shown in FIG. 4C, a plurality of shot patterns 36 of the same number as the holes 22 are formed at a time by multiple beams which have been formed by passing through respective corresponding holes 22 of the aperture member 203. For example, a beam which passed through one hole A of the aperture member 203 irradiates the position "A" shown in FIG. 4C and forms a shot pattern 36 at this position. Similarly, a beam which passed through one hole B of the aperture member 203 irradiates the position "B" shown in FIG. 4C and forms another shot pattern 36 at this position, for example. Hereafter, a similar operation is performed with respect to C to H. The writing apparatus 100 performs writing of each stripe 32 by the raster scan method that performs deflection such that each shot moves (scans) in the y direction or the x and y directions in order by the deflector 208 and continuously irradiates shot beams in order while moving the XY stage 105 in the x direction.

FIGS. 5A of a comparative example and 5B of the first embodiment each show an incident dose of a line and space pattern whose pattern density is 50%. FIG. 5A shows, as a comparative example, a dose profile (A) in the case of resolving the resist by a desired pattern width by emitting beams only to a position where a figure pattern exists (a line pattern part) when writing a line and space (L/S) pattern with a density of 50%. The value of an incident dose D emitted from the writing apparatus 100 is set such that a total value of one-half (½) the value of the incident dose D and the value of a backscatter dose W generated by incident beam is equal to a threshold value Eth of the resist. In this case, 1.8 is used as the threshold value Eth, and 0.8 is used as a backscatter coefficient η. The value of the incident dose D calculated using the condition described above is 2.0. The value of the backscatter dose W is 0.8, which can be calculated using D, η, and a pattern density.

On the other hand, according to the first embodiment, a region which surrounds the whole perimeter of a figure pattern and in which no figure pattern is arranged is also irradiated by electron beams in addition to the region where a figure pattern is arranged. FIG. 5B shows, as the first embodiment, the case of writing a line and space (L/S) pattern with a density of 50%, and specifically, it shows a dose profile (B) in the case of resolving the resist, where a pattern exists, by a desired pattern width by not only emitting beams to a position (a line pattern part) where a pattern exists but also emitting beams of an incident dose H, small enough to keep from resolving a pattern, to a position where no pattern exists (a space part). In FIG. 5B, the case where the total dose at a place without a figure pattern is βEth (for example, 0.8 Eth) is described. Here, the threshold value Eth for resolving the resist by a desired size is the same as that in FIG. 5A. In such a case, in addition to a backscatter dose $W_1$ of the backscattering by irradiation of an electron beam with an incident dose D emitted from the writing apparatus 100, occurring in a region where a figure pattern exists, there occurs a backscatter dose $W_2$ by irradiation of an electron beam with the incident dose H, which does not resolve the resist, in a region where no pattern exists. In such a case, the value of the incident dose D emitted from the writing apparatus 100 is obtained such that the sum of one-half (½) of the incident dose D to a pattern, the backscatter dose $W_1$ due to the incident dose D, and the backscatter dose $W_2$ due to the incident dose H of a beam to the outside of a pattern is equal to the threshold value Eth. In other words, if the sum of the backscatter dose $W_1$ in a pattern forming region and the backscatter dose $W_2$ in a no-pattern forming region is set to be greater than the backscatter dose W shown in FIG. 5A, the incident dose D of FIG. 5B can be smaller than the incident dose D of FIG. 5A. In the example of FIG. 5B, although the backscatter dose $W_1$ in a pattern forming region is small since the incident dose D is small, since there is electron beam irradiation of the incident dose H, the sum of the backscatter dose $W_1$ and the backscatter dose $W_2$ can be greater than the backscatter dose W shown in FIG. 5A. Moreover, the value of the incident dose H is obtained such that the sum of one-half (½) of the value of the dose H to the outside of a pattern, the backscatter dose $W_1$ due to the incident dose D, and the backscatter dose $W_2$ due to the beam dose H to the outside of the pattern is equal to a threshold value βEth. Thus, the values of the incident doses D and H obtained by the way described above are respectively 1.71 and 0.68. That is, according to the first embodiment, the incident dose D can be smaller than that in the case where electron beams irradiate only the region with a pattern where a figure patter exists.

Figures 6A, 6B:
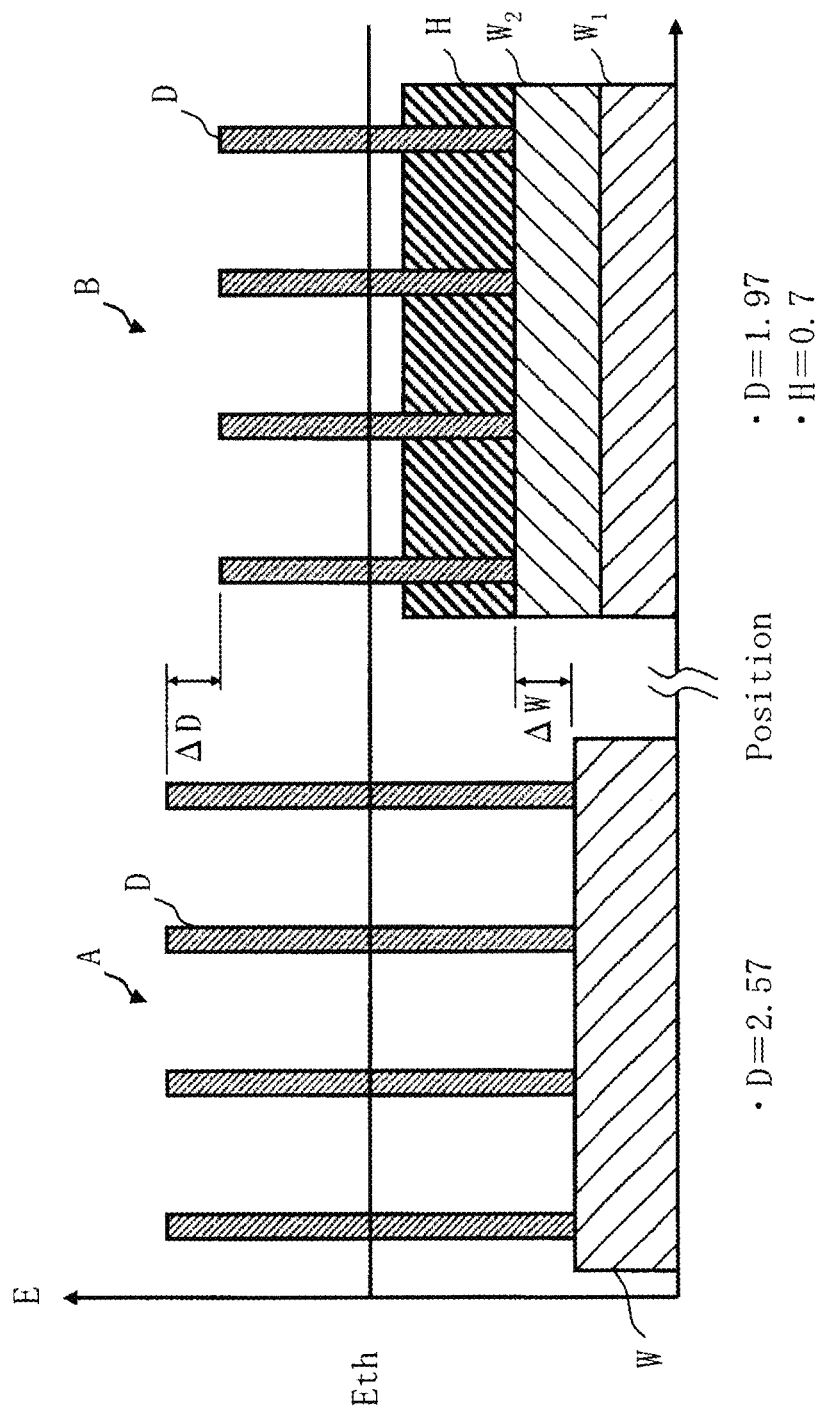
FIGS. 6A of a comparative example and 6B of the first embodiment each show an incident dose of a line and space pattern whose pattern density is 25%.

FIGS. 6A of a comparative example and 6B of the first embodiment each show an incident dose of a line and space pattern whose pattern density is 25%. As well as the case of FIGS. 5A and 5B, FIG. 6A shows, as a dose profile (A) being a comparative example, an incident dose in the case of emitting electron beams only to a pattern forming region (a line pattern) whose pattern density is 25%. FIG. 6B shows, as the first embodiment, an incident dose B in the case of emitting beams to a pattern forming region whose pattern density is 25% and a no-pattern forming region. In FIG. 6A, since the pattern density is low compared with FIG. 5A, a backscatter dose W by irradiation of an electron beam with an incident dose D shown by a dose profile (B) is small compared with that of FIG. 5A. Therefore, the incident dose D shown by the dose profile (B) is large compared with that of FIG. 5A. In other words, in the case of the pattern density of 25%, the incident dose D needed for resolving the resist is larger than that in the case of the pattern density of 50%. In the example of FIG. 6A, the incident dose D is D=2.57.

By contrast, according to the first embodiment, a pattern forming region whose pattern density is 25% and a no-pattern forming region are irradiated by electron beams. In such a case, in addition to a backscatter dose $W_1$ of the backscattering by irradiation of an electron beam with an incident dose D emitted from the writing apparatus 100, occurring in a region where a figure pattern exists, there occurs a backscatter dose $W_2$ by irradiation of an electron beam with an incident dose H, which does not resolve the resist, in a region where no pattern exists. Therefore, if the sum of the backscatter dose $W_1$ in a pattern forming region and the backscatter dose $W_2$ in a no-pattern forming region is set to be greater than the backscatter dose W shown in FIG. 6A, the incident dose D of FIG. 6B can be smaller than the incident dose D of FIG. 6A. For example, in the example of FIG. 6B, the incident doses D and H can be D=1.97 and H=0.7. Thus, according to the first embodiment, even in the case of the pattern density of 25%, the dose density can be smaller than that in the case where electron beams irradiate only the pattern forming region.

Figures 7A, 7B:
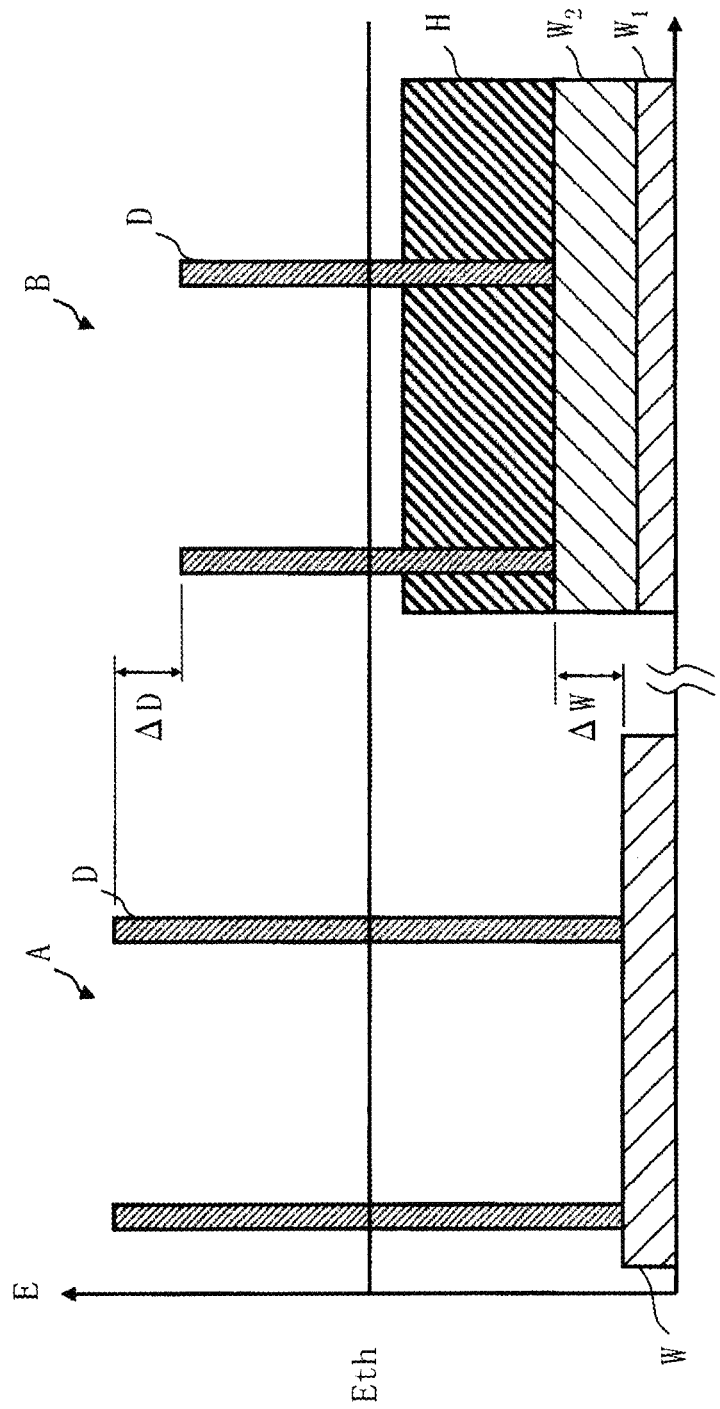
FIGS. 7A of a comparative example and 7B of the first embodiment each show an incident dose of a line and space pattern whose pattern density is 10%.

FIGS. 7A of a comparative example and 7B of the first embodiment each show an incident dose of a line and space pattern whose pattern density is 10%. As well as the case of FIGS. 5A and 5B, FIG. 7A shows, as a comparative example A, an incident dose in the case of emitting electron beams only to a pattern forming region (a line pattern) whose pattern density is 10%. FIG. 7B shows, as the first embodiment, an incident dose B in the case of emitting beams to a pattern forming region whose pattern density is 10% and a no-pattern forming region. In FIG. 7A, since the pattern density is low compared with those of FIGS. 5A and 6A, a backscatter dose W by irradiation of an electron beam with an incident dose D shown by the dose profile (B) is small compared with those of FIG. 5A and FIG. 6A. Therefore, the incident dose D shown by the dose profile (B) is large compared with those of FIGS. 5A and 6A. In other words, in the case of the pattern density of 10%, the incident dose D needed for resolving the resist is larger than those in the cases of pattern densities of 50% and 25%. In the example of FIG. 7A, the incident dose D is D=3.1.

By contrast, according to the first embodiment, a pattern forming region whose pattern density is 10% and a no-pattern forming region are irradiated by electron beams. In such a case, in addition to a backscatter dose $W_1$ of the backscattering by irradiation of an electron beam with an incident dose D emitted from the writing apparatus 100, occurring in a region where a figure pattern exists, there occurs a backscatter dose $W_2$ by irradiation of an electron beam with an incident dose H, which does not resolve the resist, in a region where no pattern exists. Therefore, if the sum of the backscatter dose $W_1$ in a pattern forming region and the backscatter dose $W_2$ in a no-pattern forming region is set to be greater than the backscatter dose W shown in FIG. 7A, the incident dose D of FIG. 7B can be smaller than the incident dose D of FIG. 7A. For example, in the example of FIG. 7B, the incident doses D and H can be D=2.16 and H=0.75. Thus, according to the first embodiment, even in the case of the pattern density of 10%, the dose density can be smaller than that in the case where electron beams irradiate only the pattern forming region.

Figure 8:
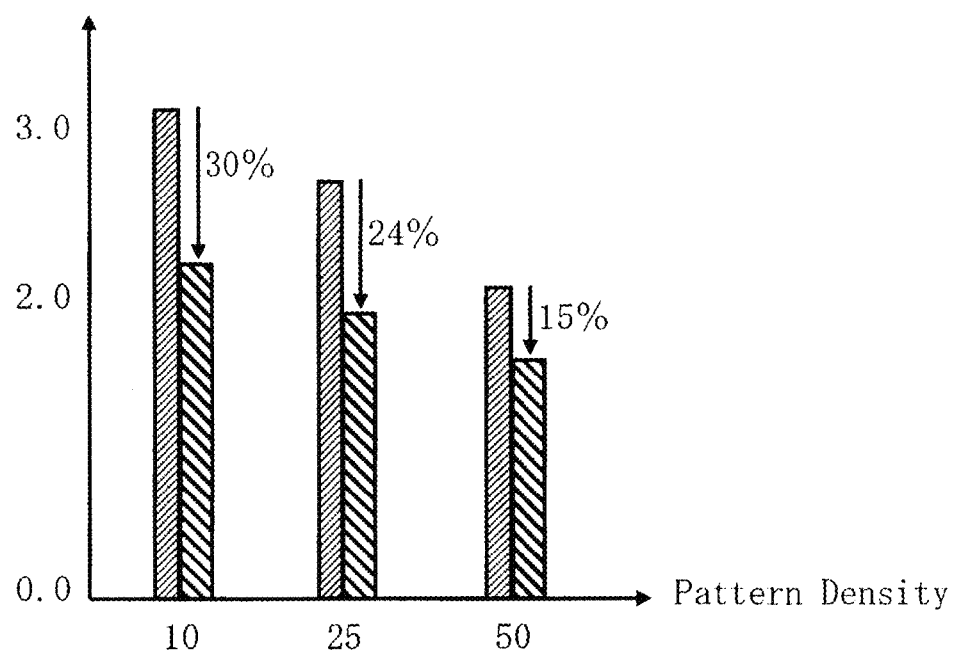
FIG. 8 illustrates a reduction effect of an incident dose for each pattern density in the first embodiment and comparative examples.

FIG. 8 illustrates a reduction effect of an incident dose for each pattern density in the first embodiment and comparative examples. According to the first embodiment, compared with the comparative examples described above, as shown in FIG. 8, about 30% of the incident dose can be reduced in the case of the pattern density of 10%. About 24% can be reduced in the case of the pattern density of 25%. About 15% can be reduced in the case of the pattern density of 50%. That is, when it is possible to reduce an incident dose, the irradiation time of one shot beam can be shortened because of the incident dose reduction, thereby reducing the writing time. Moreover, according to the first embodiment, as shown in FIG. 8, the difference between necessary incident doses, which is caused by a pattern density difference, can be made small. In other words, the influence of a pattern density on a writing time can be mitigated.

Figure 9:
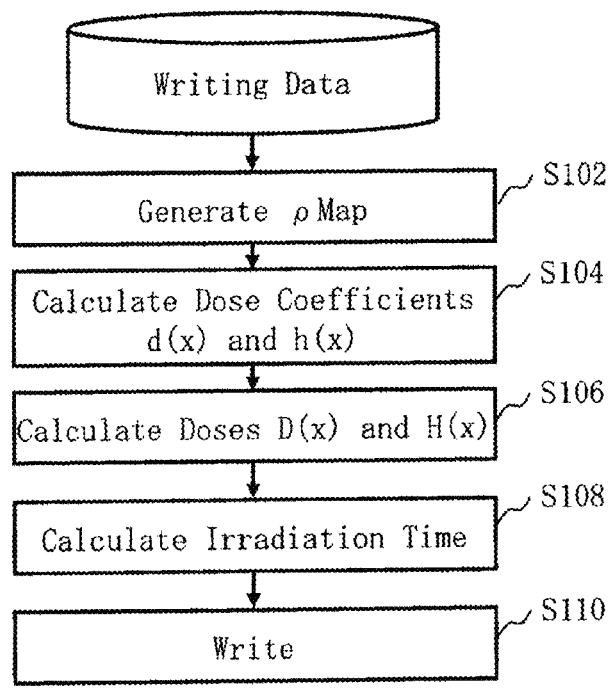
FIG. 9 is a flowchart showing main steps of a writing method according to the first embodiment.

FIG. 9 is a flowchart showing main steps of a writing method according to the first embodiment. In FIG. 9, the writing method executes a series of steps: a pattern density map generation step (S102), a dose coefficient calculation step (S104), a dose calculation step (S106), an irradiation time calculation step (S108), and a writing step (S110).

In the pattern density map generation step (S102), the pattern density calculation unit 52 retrieves writing data from the storage device 140, and calculates a pattern density ρ (a pattern area density) of an arranged figure pattern, for each mesh region of a plurality of mesh regions obtained by virtually dividing the writing region into meshes by a predetermined size. Then, the pattern density calculation unit 52 generates a pattern density map in which a pattern density ρ of each mesh region is defined.

In the dose coefficient calculation step (S104), the dose coefficient calculation unit 54 calculates a dose coefficient d(x) (a first dose coefficient) for calculating an incident dose D that resolves the resist, for a beam of multiple beams which is corresponding to a region where a figure pattern is arranged. Furthermore, the dose coefficient calculation unit 54 calculates a dose coefficient h(x) (a second dose coefficient) for calculating an incident dose H that does not resolve the resist, for a beam of multiple beams that is corresponding to a region which surrounds the whole perimeter of the figure pattern and in which no figure pattern is arranged. The dose coefficient d(x) for a region with a figure pattern, and the dose coefficient h(x) for a no-pattern forming region can be defined by the following equations (1-1) and (1-2). The equation (1-1) is a dose equation for a region in which a figure pattern is arranged. The equation (1-2) is a dose equation for a region in which no figure pattern is arranged.

$$\frac{d(x_1)}{2} + \eta \int d(x'_1) G(x_1 - x'_1) dx'_1 + \eta \int h(x'_2) G(x_1 - x'_2) dx'_2 = Eth \quad (1\text{-}1)$$

$$h(x_2) + \eta \int d(x'_1) G(x_2 - x'_1) dx'_1 + \eta \int h(x'_2) G(x_2 - x'_2) dx'_2 = \beta Eth \quad (1\text{-}2)$$

Here, "x" denotes a vector. In other words, two-dimensional coordinates (x, y) can be denoted just by "x". "$x_1$" denotes the position of a region in which a figure pattern is arranged, and "$x_2$" denotes the position of a region in which no figure pattern is arranged. G(x) denotes a distribution function. A coefficient β is a coefficient for performing setting such that the sum of the backscatter dose and the dose coefficient h(x) does not exceed a threshold value Eth. The coefficient β should be set to be β<1.0. η denotes a backscatter coefficient. As to the integration range of the equations (1-1) and (1-2), it is a region where a figure pattern exists with respect to the second term (an integral term using $x_1$) of the left side of each equation, and it is a region where no figure pattern exists with respect to the third term (an integral term using $x_2$) of the left side of each equation. When actually calculating the equations (1-1) and (1-2), the pattern density p defined in the pattern density map can be preferably used.

In the dose calculation step (S106), the dose calculation unit 56 calculates an incident dose D(x) (a first dose) that resolves the resist, for a beam of multiple beams which is corresponding to a region where a figure pattern is arranged. Furthermore, the dose calculation unit 56 calculates an incident dose H(x) (a second dose) that does not resolve the resist, for a beam of multiple beams that is corresponding to a region which surrounds the whole perimeter of the figure pattern and in which no figure pattern is arranged. The incident dose D(x) is calculated by multiplying an obtained dose coefficient d(x) by a base dose. The incident dose H(x) is calculated by multiplying an obtained dose coefficient h(x) by a base dose.

In the irradiation time calculation step (S108), the irradiation time calculation unit 58 calculates an irradiation time "t" corresponding to the dose D(x) or the dose H(x) at each position in the writing region. The irradiation time "t" can be calculated by dividing the dose by a current density "J" of the electron beam.

In the writing step (S110), under the control of the writing control unit 60, the deflection control circuit 130 (a deflection control unit) controls a plurality of blankers of the blanking plate 204 so that the dose (an irradiation time) may be calculated according to the position when each of multiple beams irradiates each position. Specifically, the deflection control circuit 130 outputs a control signal of a calculated dose (a calculated irradiation time) to each DAC amplifier 134. Then, the DAC amplifier 134 converts the digital signal to an analog signal and applied it as a deflection voltage to a plurality of blankers of the blanking plate 204. For example, it is preferable not to apply a voltage in the case of "beam ON", and to apply a voltage to deflect a corresponding beam in the case of "beam OFF". The writing unit 150 writes a region in which a figure pattern exists by using a beam with a dose D(x) in multiple beams, and writes a region which surrounds the whole perimeter of the figure pattern and in which no figure pattern exists by using a beam with a dose H(x) in multiple beams.

Figure 10:
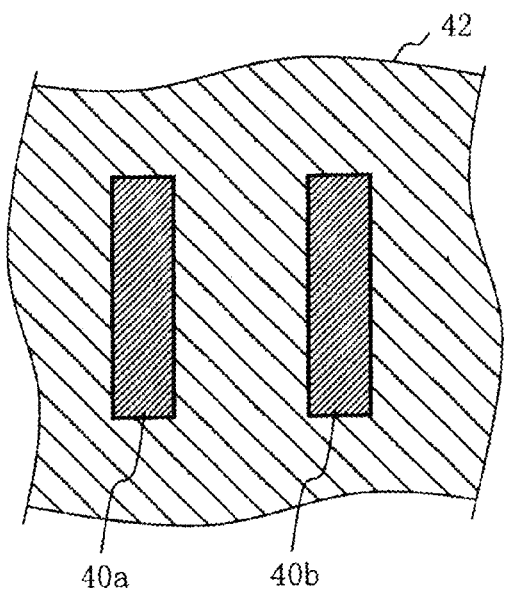
FIG. 10 shows an example of a figure pattern and a no-pattern forming region according to the first embodiment.

FIG. 10 shows an example of a figure pattern and a no-pattern forming region according to the first embodiment. For example, when a plurality of figure patterns 40*a* and 40*b* are arranged to be neighboring to each other as shown in FIG. 10, a region 42 without a figure pattern is set such that it surrounds the whole of a plurality of figure patterns 40*a* and 40*b*. According to the first embodiment, the region 42 without a figure pattern, which surrounds the whole perimeter of the figure pattern 40*a* and the whole perimeter of the figure pattern 40*b* and is irradiated by a beam, is defined as a region in contact with the figure patterns 40*a* and 40*b*.

Figure 11:
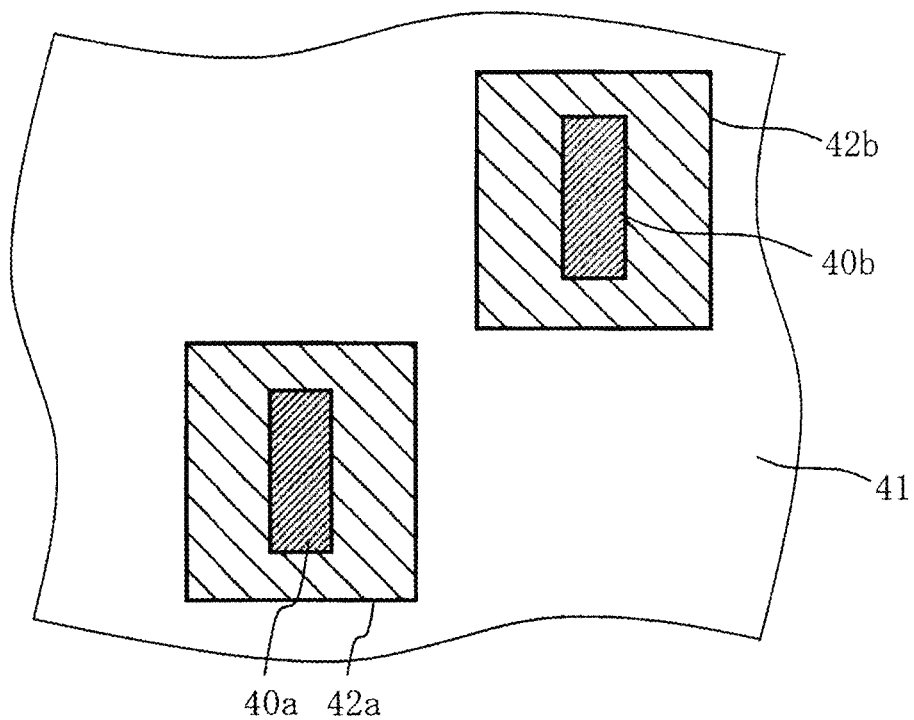
FIG. 11 shows another example of a figure pattern and a no-pattern forming region according to the first embodiment.

FIG. 11 shows another example of a figure pattern and a no-pattern forming region according to the first embodiment. For example, when a plurality of figure patterns 40*a* and 40*b* are arranged having a distance from each other as shown in FIG. 11, it is also preferable for the region 42 without a figure pattern to be separated to a region 42*a* without a figure pattern, which surrounds the whole perimeter of the figure pattern 40*a*, and a region 42*b* without a figure pattern, which surrounds the whole perimeter of the figure pattern 40*b*, instead of surrounding the whole of a plurality of figure patterns 40*a* and 40*b*. It is also preferable that there is a region 41, which is not irradiated by an electron beam, between the region 42*a* without a figure pattern and the region 42*b* without a figure pattern.

As described above, according to the first embodiment, it is possible to increase the backscatter dose at the position of a figure pattern by emitting a dose small enough to keep from resolving the resist on the target object 101 to a region which surrounds the whole perimeter of the figure pattern and in which no figure pattern is arranged, thereby reducing the dose D. Accordingly, the irradiation time of each shot can be shortened, and, further, the writing time of the entire writing processing can be reduced.

As described above, according to the first embodiment, the writing time of writing by the multi-beam system can be reduced. Moreover, the influence of pattern density on the writing time can be mitigated.

Second Embodiment

In the above first embodiment, the region in which no figure pattern is arranged and which surrounds the whole perimeter of a figure pattern and is irradiated by the beam is defined as a region in contact with the figure pattern, but it is not limited thereto. The second embodiment describes other cases.

Figure 12:
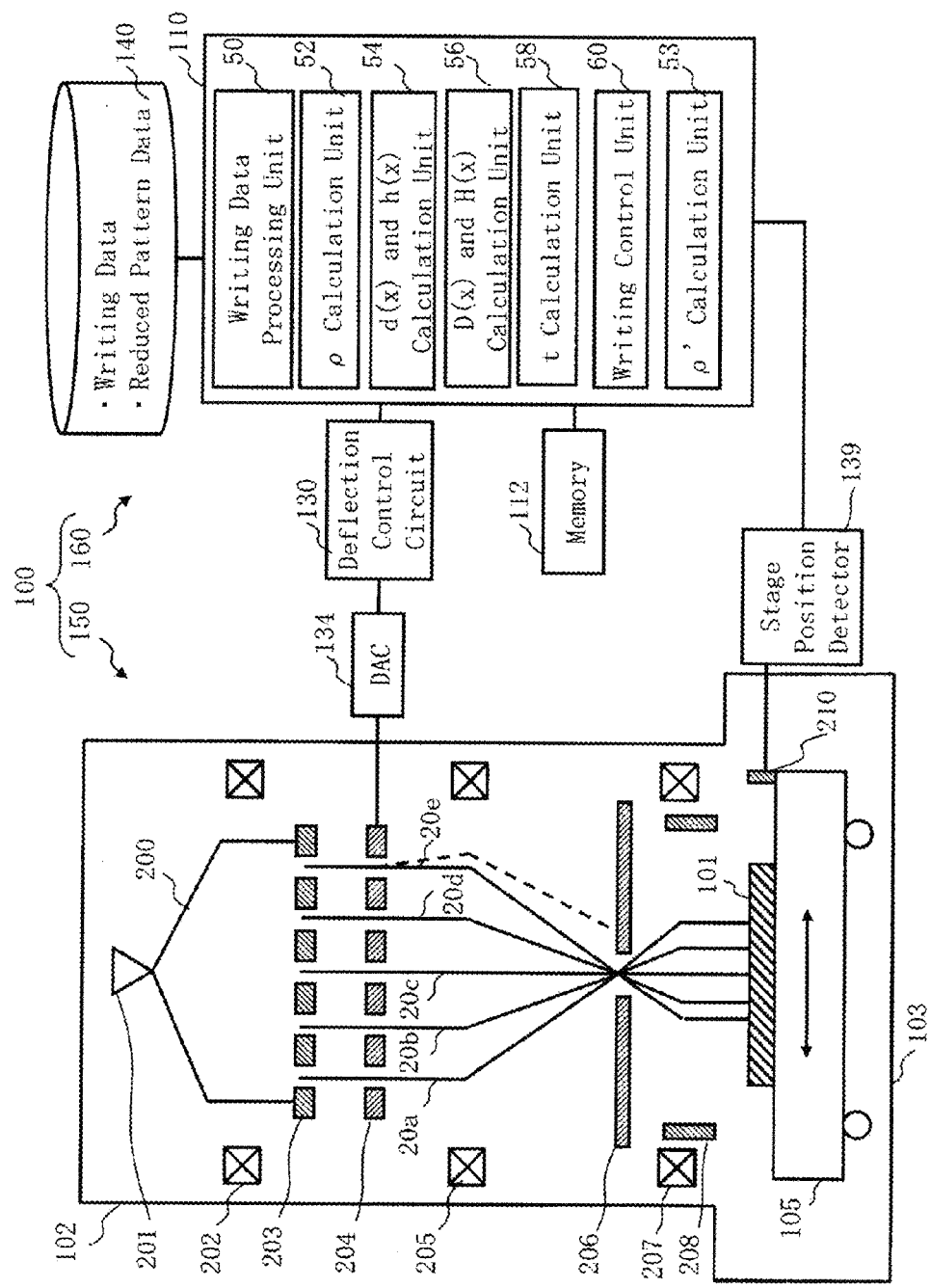
FIG. 12 is a schematic diagram showing a structure of a writing apparatus according to the second embodiment.

FIG. 12 is a schematic diagram showing a structure of a writing apparatus according to the second embodiment. The writing apparatus 100 of FIG. 12 is the same as that of FIG. 1 except that the writing data processing unit 50 and a pattern density calculation unit 53 are added in the control computer 110, and that reduced pattern data is stored in the storage device 140.

Figure 13:
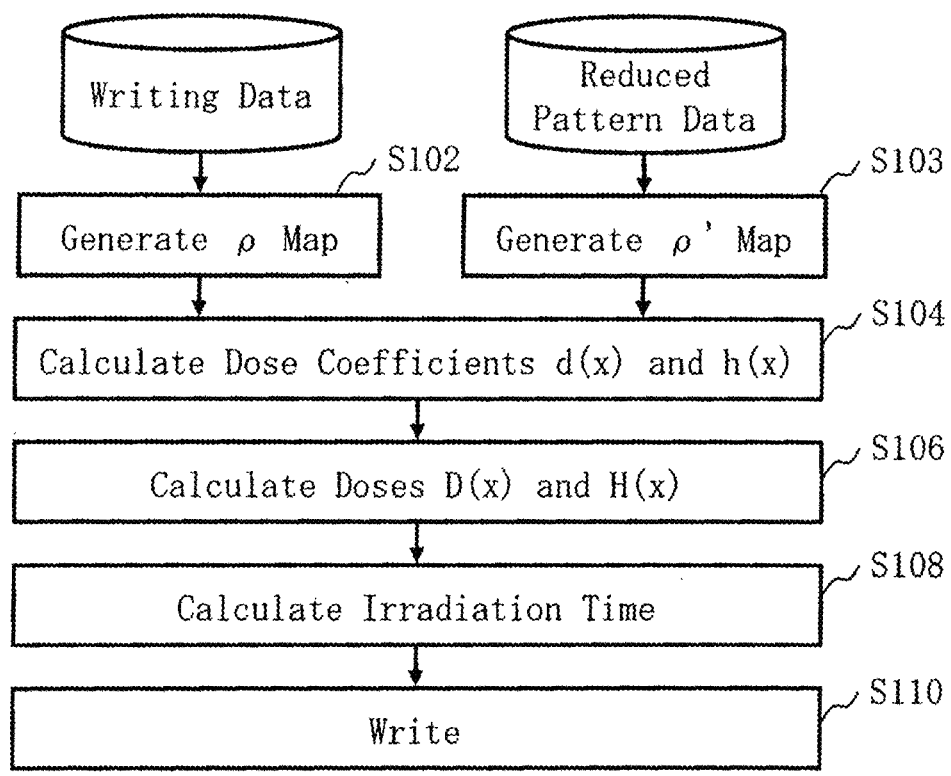
FIG. 13 is a flowchart showing main steps of a writing method according to the second embodiment.

FIG. 13 is a flowchart showing main steps of a writing method according to the second embodiment. FIG. 13 is the same as FIG. 9 except that a pattern density map generation step (S103) is added before the dose coefficient calculation step (S104). The content of the second embodiment is the same as that of the first embodiment except what is particularly described below.

Figure 14:
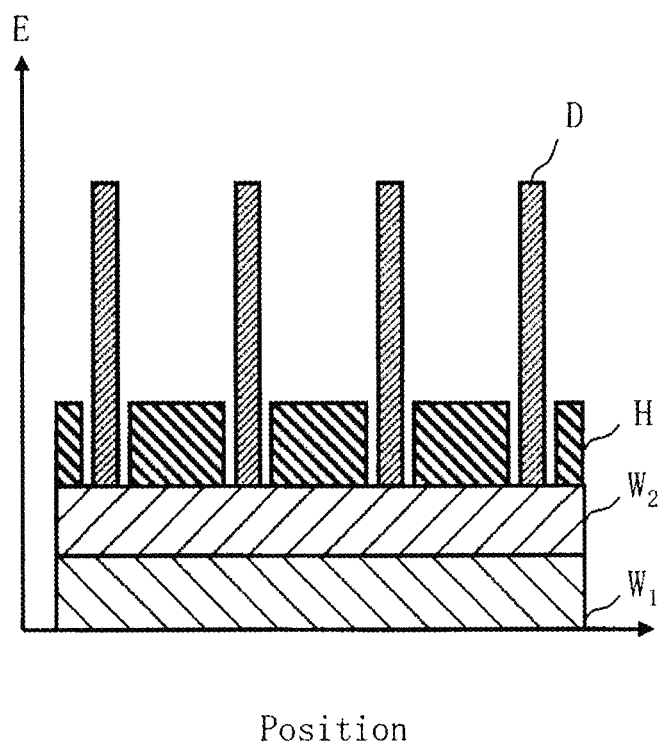
FIG. 14 illustrates an incident dose of a line and space pattern whose pattern density is 25% according to the second embodiment.

FIG. 14 illustrates an incident dose of a line and space pattern whose pattern density is 25% according to the second embodiment. As shown in FIG. 14, according to the second embodiment, a space is provided between a figure pattern and a region in which no figure pattern exists and which surrounds the figure pattern and is irradiated by a beam. As has been described in the first embodiment, when a figure pattern and a region in which no pattern is arranged and which is irradiated by a beam are adjacent to each other, since the dose D irradiated for the figure pattern and the dose H irradiated for a region without a figure region are compounded at the end part (edge) in the line width direction of the figure pattern, the dose at the pattern edge part is large. Therefore, there is a possibility that the dimension precision deteriorates. Then, according to the second embodiment, the dose overlapping is reduced by providing a space between a figure pattern and a region in which no figure pattern exists and which surrounds the figure pattern and is irradiated by a beam. Thereby, the dimension precision at a pattern edge part can be increased. As for the space, it is sufficient to be just a space of about one beam width, for example.

Figure 15:
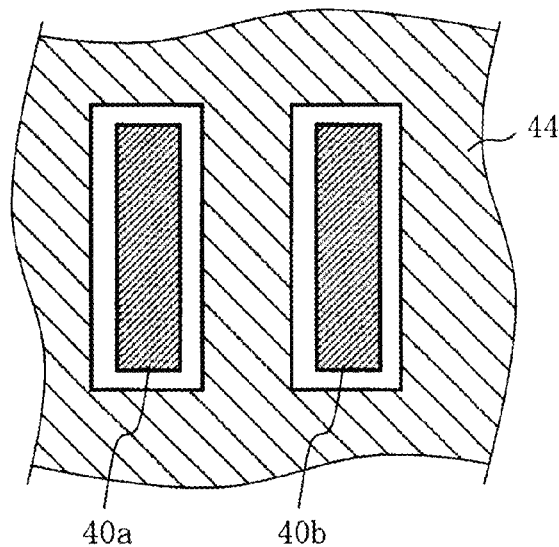
FIG. 15 shows an example of a figure pattern and a no-pattern forming region according to the second embodiment.

FIG. 15 shows an example of a figure pattern and a no-pattern forming region according to the second embodiment. For example, when a plurality of figure patterns 40*a* and 40*b* are arranged to be neighboring to each other as shown in FIG. 15, a region 44 without a figure pattern is set such that it surrounds the whole of a plurality of figure patterns 40*a* and 40*b*. According to the second embodiment, the region 44 in which no figure pattern is arranged, and which surrounds the whole perimeter of the figure pattern 40*a* and the whole perimeter of the figure pattern 40*b* and is irradiated by a beam, is defined as a region not being in contact with the figure patterns 40*a* and 40*b* and having a space therein.

Figure 16:
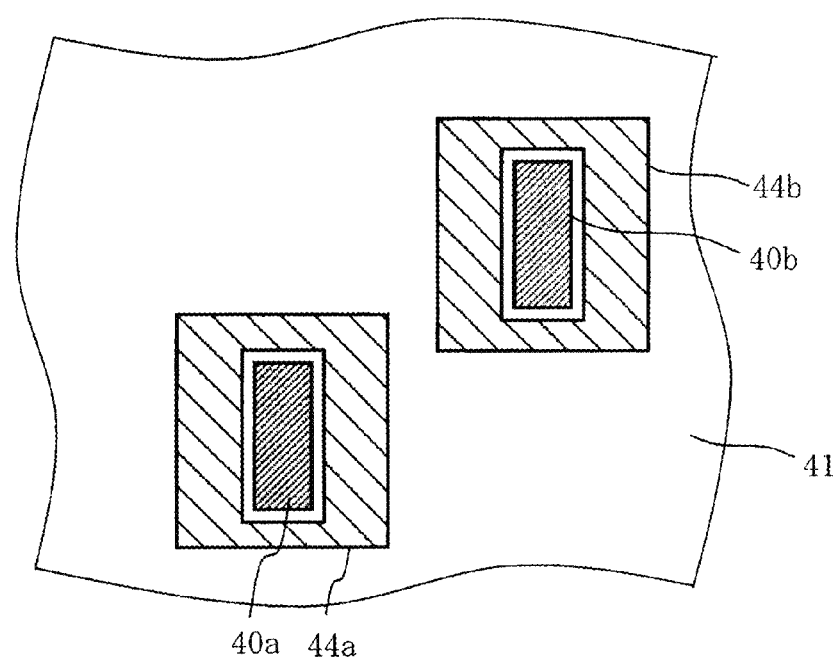
FIG. 16 shows another example of a figure pattern and a no-pattern forming region according to the second embodiment.

FIG. 16 shows another example of a figure pattern and a no-pattern forming region according to the second embodiment. For example, when a plurality of figure patterns 40*a* and 40*b* are arranged having a distance from each other as shown in FIG. 16, it is also preferable for the region 44 without a figure pattern to be separated to a region 44*a* without a figure pattern, which surrounds the whole perimeter of the figure pattern 40*a*, and a region 44*b* without a figure pattern, which surrounds the whole perimeter of the figure pattern 40*b*, instead of surrounding the whole of a plurality of figure patterns 40*a* and 40*b*. It is also preferable that there is the region 41, which is not irradiated by an electron beam, between the region 44*a* without a figure pattern and the region 44*b* without a figure pattern.

According to the second embodiment, first, is prepared writing data for a region in which no figure pattern is arranged and which is not in contact with a figure pattern but surrounds the figure pattern. The writing data generates pattern data of a reversed pattern obtained by reversing a figure pattern and a part in which no figure pattern is arranged. Then, pattern data of a reduced pattern is generated by reducing the pattern data of the reversed pattern. It is preferable that the pattern data (reduced pattern data) of the reduced pattern is generated in the off-line of the writing apparatus 100. The reduced pattern data is input into the writing apparatus 100 from the outside, and stored in the storage device 140. Thus, in the case of generating reduced pattern data outside the writing step 100, the writing data processing unit 50 is not needed.

In the pattern density map generation step (S102), as described above, a pattern density map of an original figure pattern is generated.

In the pattern density map generation step (S103), the pattern density calculation unit 53 retrieves reduced pattern data from the storage device 140, and calculates a pattern density p' (a pattern area density) of an arranged reduced figure pattern, for each mesh region of a plurality of mesh regions obtained by virtually dividing the writing region into meshes by a predetermined size. Then, the pattern density calculation unit 53 generates a pattern density map in which a pattern density p' of each mesh region is defined.

In the dose coefficient calculation step (S104), the dose coefficient calculation unit 54 calculates a dose coefficient d(x) (the first dose coefficient) for calculating an incident dose D that resolves the resist, for a beam of multiple beams which is corresponding to a region where a figure pattern is arranged. Furthermore, the dose coefficient calculation unit 54 calculates a dose coefficient h(x) (the second dose coefficient) for calculating an incident dose H that does not resolve the resist, for a beam of multiple beams which is corresponding to a reduced pattern arrangement region, where a reduced pattern is arranged, included in a region which surrounds the whole perimeter of the figure pattern and in which no figure pattern is arranged. The dose coefficient d(x) for a region in which a figure pattern is arranged, and the dose coefficient h(x) for a region in which a reduced pattern is arranged can be defined by the equations (1-1) and (1-2) described above. $x_1$ denotes the position of a region in which a figure pattern is arranged, and $x_2$ denotes the position of a region in which a reduced pattern is arranged.

In the dose calculation step (S106), the dose calculation unit 56 calculates a dose D(x) (the first dose) that resolves the resist, for a beam of multiple beams which is corresponding to a region where a figure pattern is arranged. Furthermore, the dose calculation unit 56 calculates a dose H(x) (the second dose) that does not resolve the resist, for a beam of multiple beams which is corresponding to a reduced pattern arrangement region, where a reduced pattern is arranged, included in a region which surrounds the whole perimeter of the figure pattern and in which no figure pattern is arranged. The dose D(x) is calculated by multiplying an obtained dose coefficient d(x) by a base dose. The dose H(x) is calculated by multiplying an obtained dose coefficient h(x) by a base dose.

In the irradiation time calculation step (S108), the irradiation time calculation unit 58 calculates an irradiation time "t" corresponding to the dose D(x) or the dose H(x) at each position in the writing region.

In the writing step (S110), under the control of the writing control unit 60, the deflection control circuit 130 (the deflection control unit) controls a plurality of blankers of the blanking plate 204 so that the dose may be calculated according to the position when each of multiple beams irradiates each position. Then, the writing unit 150 writes a region where a figure pattern is arranged by using a beam with a dose D(x) in multiple beams, and writes a reduced pattern arrangement region, where a reduced pattern is arranged, included in a region in which no figure pattern is arranged and which surrounds the whole perimeter of the figure pattern. Thus, according to the second embodiment, a reduced pattern obtained by reducing a reversed pattern which is generated by reversing a figure pattern and a part where no figure pattern is arranged.

As described above, according to the second embodiment, it is possible to increase the backscatter dose at the position of a figure pattern by providing a space between figure patterns and emitting a dose small enough to keep from resolving the resist on the target object 101 to a region which surrounds the whole perimeter of the figure pattern and in which no pattern is arranged, thereby reducing the dose D. Accordingly, the irradiation time of each shot can be shortened and, further, the writing time of the entire writing processing can be reduced.

As described above, according to the second embodiment, the writing time of writing by the multi-beam system can be reduced. Moreover, the influence of pattern density on the writing time can be mitigated. Furthermore, it is possible to highly precisely write the line width of a figure pattern by providing a space.

In the examples described above, reduced pattern data is generated outside the writing apparatus 100, but however, it may be generated inside the within the writing apparatus 100. In such a case, the writing data processing unit 50 inputs writing data from the storage device 140, and generates a reversed pattern by reversing a figure pattern and a part in which no figure pattern is arranged. Then, further, the writing data processing unit 50 should generate data of a reduced pattern obtained by reducing a reversed pattern at a predetermined reduction rate.

Third Embodiment

In the first embodiment as mentioned above, the coefficient β of the equation (1-2) is described in the range of a specified value. However, the value of the coefficient β is not limited to the case of being a certain value in a series of steps. Another case will be explained in the third embodiment.

Figure 17:
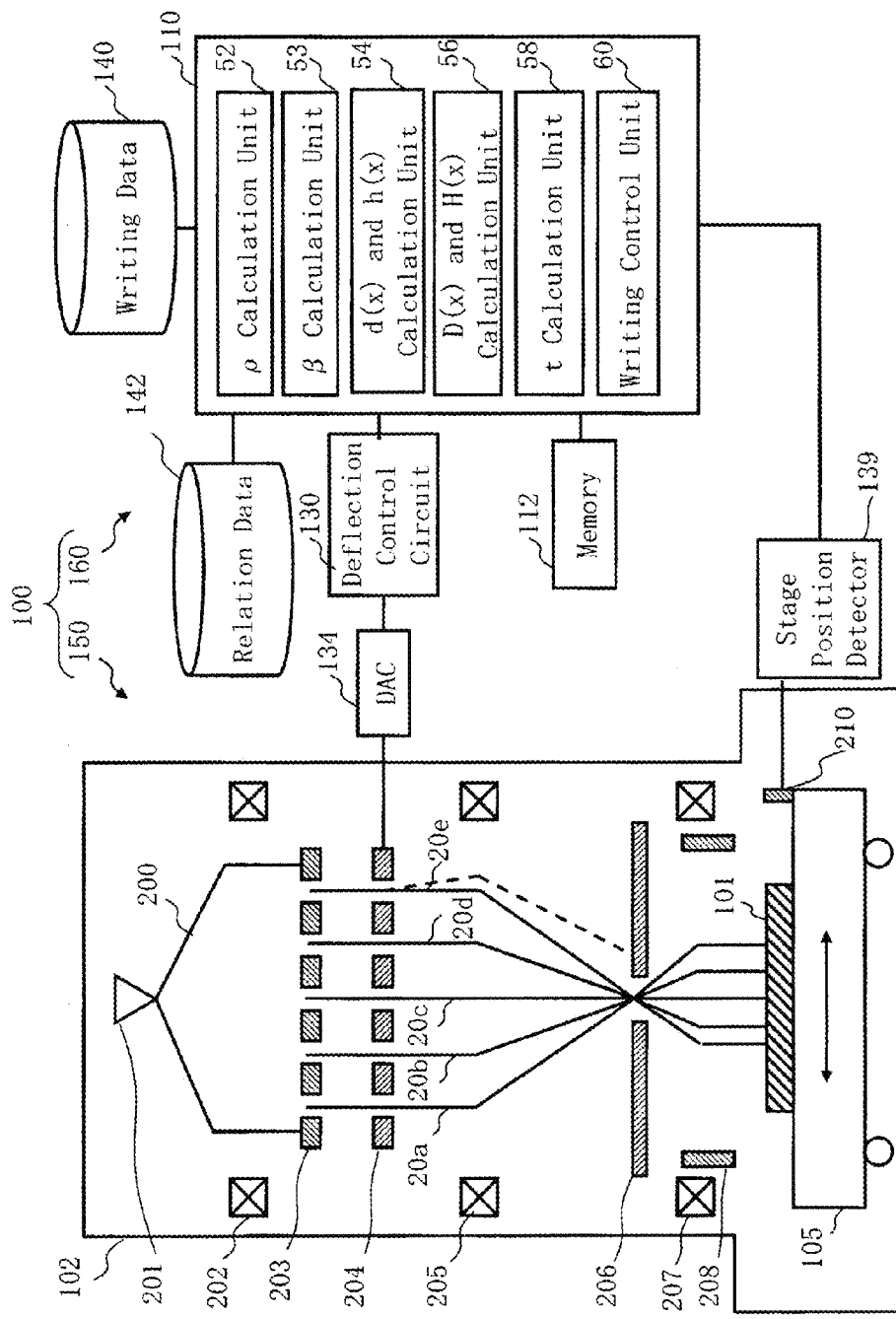
FIG. 17 is a schematic diagram showing a structure of a writing apparatus according to the third embodiment.

FIG. 17 is a schematic diagram showing a structure of a writing apparatus according to the third embodiment. The writing apparatus 100 of FIG. 17 is the same as that of FIG. 1 except that a β calculation unit 53 is added in the control computer 110, and a storage device 142 such as a magnetic disk is added.

Figure 18:
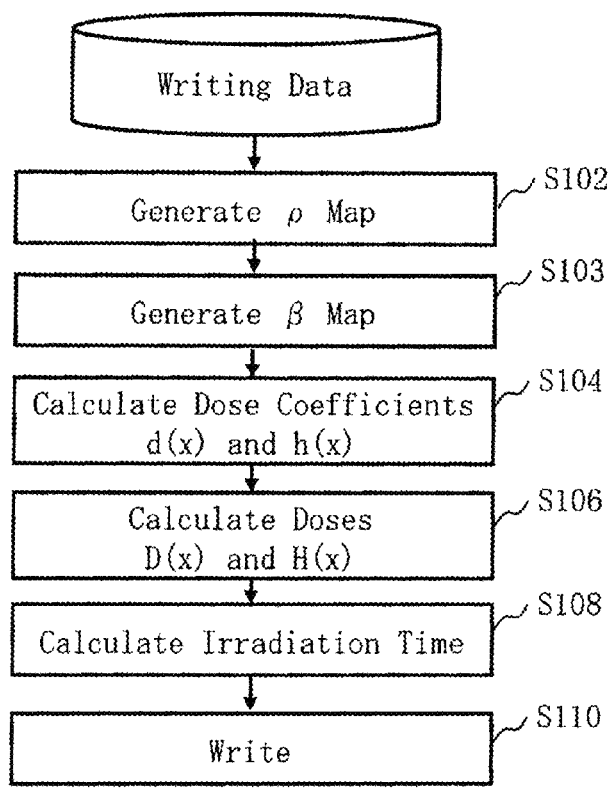
FIG. 18 is a flowchart showing main steps of a drawing method according to the third Embodiment.

FIG. 18 is a flowchart showing main steps of a drawing method according to the third Embodiment. FIG. 18 is the same as FIG. 9 except that a β map generation step (S103) is added before the dose coefficient calculation step (S104). The content of the third embodiment is the same as that of the first embodiment except what is particularly described below.

Figure 19:
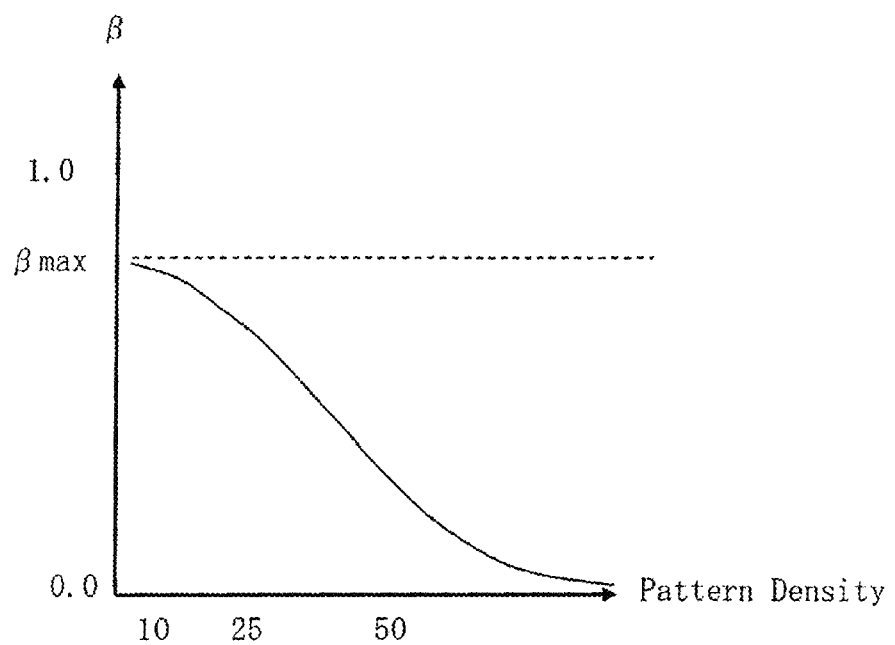
FIG. 19 illustrates setting the value of β from a pattern density when generating a β map according to the third embodiment.

FIG. 19 illustrates setting the value of β from a pattern density when generating a β map according to the third embodiment. FIG. 19 shows, as a relation between a coefficient β and a pattern density, an example of the case where as the pattern density ρ becomes high, the value of the coefficient β becomes low from a certain set value βmax to 0 (zero). The range of the value of βmax is 0<βmax<1. In Embodiment 3, the value of the coefficient β which is variable depending on the pattern density is selected based on a relation between the coefficient β and the pattern density as shown in FIG. 19. The coefficient β, pattern densities, and relation data (relational equation) are stored in advance in the storage device 142. By this, it becomes possible to increase or decrease additional irradiation, depending upon the pattern density, high or low. Owing to using this method, it is possible to suppress a pattern line width change due to the density of a pattern, which is known as a loading effect, from becoming large because of the influence of additional irradiation to a place other than the pattern.

According to the third embodiment, in the pattern density map generation step (S102), the pattern density calculation unit 52 retrieves writing data from the storage device 140, and calculates a pattern density ρ (a pattern area density) of an arranged figure pattern, for each mesh region of a plurality of mesh regions obtained by virtually dividing the writing region into meshes by a predetermined size. Then, the pattern density calculation unit 52 generates a pattern density map in which a pattern density ρ of each mesh region is defined. The pattern density map is stored in advance in the memory 142.

In a β map generation step (S103), the β calculation unit 53 retrieves a pattern density map and a relational equation of a coefficient β and a pattern density p shown in FIG. 19 from the storage device 142, and calculates the coefficient β based on the value of the pattern density, for each mesh region of a plurality of mesh regions obtained by virtually dividing the writing region into meshes by a predetermined size. The β calculation unit 53 generates a β map in which the coefficient β is defined for each mesh region.

In the dose coefficient calculation step (S104), the dose coefficient calculation unit 54 calculates a dose coefficient d(x) (the first dose coefficient) for calculating an incident dose D that resolves the resist, for a beam of multiple beams which is corresponding to a region where a figure pattern is arranged. Furthermore, the dose coefficient calculation unit 54 calculates a dose coefficient h(x) (the second dose coefficient) for calculating an incident dose H that does not resolve the resist, for a beam of multiple beams that is corresponding to a region which surrounds the whole perimeter of the figure pattern and in which no figure pattern is arranged. The dose coefficient (x) for a pattern forming region, and the dose coefficient h(x) for a no-pattern forming region can be defined by the equation (1-1) and the following equation (1-3). The equation (1-1), being the same as that of the first embodiment, is a dose equation for a region in which a figure pattern is arranged. The equation (1-3) is a dose equation for a region in which no figure pattern is arranged.

$$h(x_2)+\eta\int d(x_1')G(x_2-x_1')dx_1'+\eta\int h(x_2')G(x_2-x_2')dx_2'=\beta(x_2)Eth \quad (1\text{-}3)$$

Here, "x" denotes a vector. In other words, two-dimensional coordinates (x, y) can be denoted just by "x". "$x_1$" denotes the position of a region in which a figure pattern is arranged, and "$x_2$" denotes the position of a region in which no figure pattern is arranged. G(x) denotes a distribution function. A coefficient β is a coefficient for performing setting such that the sum of the backscatter dose and the dose coefficient h(x) does not exceed a threshold value Eth. A coefficient β(x) is read from the β map. η denotes a backscatter coefficient. As to the integration range of the equations (1-1) and (1-3), it is a region where a figure pattern exists with respect to the second term (an integral term using $x_1$) of the left side of each equation, and it is a region where no figure pattern exists with respect to the third term (an integral term using $x_2$) of the left side of each equation. When actually calculating the equations (1-1) and (1-3), the pattern density ρ(x) defined in the pattern density map can be preferably used.

In the dose calculation step (S106), the dose calculation unit 56 calculates a dose D(x) (the first dose) that resolves the resist, for a beam of multiple beams which is corresponding to a region where a figure pattern is arranged. Furthermore, the dose calculation unit 56 calculates a dose H(x) (the second dose) that does not resolve the resist, for a beam of multiple beams which is corresponding to a reduced pattern arrangement region included in a region which surrounds the whole perimeter of the figure pattern and in which no figure pattern is arranged. The dose D(x) is calculated by multiplying an obtained dose coefficient d(x) by a base dose. The dose H(x) is calculated by multiplying an obtained dose coefficient h(x) by a base dose.

In the irradiation time calculation step (S108), the irradiation time calculation unit 58 calculates an irradiation time "t" corresponding to the dose D(x) or the dose H(x) at each position in the writing region.

In the writing step (S110), under the control of the writing control unit 60, the deflection control circuit 130 (the deflection control unit) controls a plurality of blankers of the blanking plate 204 so that the dose may be calculated according to the position when each of multiple beams irradiates each position. Then, the writing unit 150 writes a region where a figure pattern is arranged by using a beam with a dose D(x) in multiple beams, and writes a reduced pattern arrangement region, where a reduced pattern is arranged, included in a region in which no figure pattern is arranged and which surrounds the whole perimeter of the figure pattern. Thus, according to the third embodiment, a reduced pattern obtained by reducing a reversed pattern which is generated by reversing a figure pattern and a part where no figure pattern is arranged.

As described above, according to the third embodiment, it is possible to increase the backscatter dose at the position of a figure pattern by emitting a dose small enough to keep from resolving the resist on the target object 101 to a region which surrounds the whole perimeter of the figure pattern and in which no figure pattern is arranged, thereby reducing the dose D. Accordingly, the irradiation time of each shot can be shortened, and, further, the writing time of the entire writing processing can be reduced.

As described above, according to the third embodiment, the writing time of writing by the multi-beam system can be reduced. Moreover, the influence of pattern density on the writing time can be mitigated.

The embodiments have been explained referring to concrete examples described above. However, the present invention is not limited to these specific examples. The raster scanning operation described above is just an example. It is also acceptable to use other operation method instead of the raster scanning operation, using multiple beams.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other multi charged particle beam writing apparatus and multi charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing apparatus comprising:
   a stage configured to mount a target object and to be continuously movable, a resist having been applied to the target object;
   an emission unit configured to emit a charged particle beam;

an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings;

a plurality of blankers configured to respectively perform blanking deflection of a corresponding beam in the multiple beams having passed through the plurality of openings of the aperture member;

a blanking aperture member configured to block each beam having been deflected to be in a beam-off state by the plurality of blankers;

a dose calculation unit configured to
calculate a first dose that resolves the resist, for a first beam of the multiple beams which is corresponding to a pattern forming region, in which a figure pattern is arranged, and
calculate a second dose that does not resolve the resist, for a second beam of the multiple beams which is corresponding to a no-pattern forming region, which surrounds a whole perimeter of the figure pattern and in which no figure pattern is arranged, wherein the first dose is calculated by using the second dose and the second dose is calculated by using the first dose; and a deflection control unit configured to control the plurality of blankers so that the first beam and the second beam are irradiated on the target object, the first beam irradiated for the first dose and resolves the resist and the second beam irradiated for the second dose and does not resolve the resist.

2. The apparatus according to claim 1, wherein the no-pattern forming region, which surrounds the whole perimeter of the figure pattern and in which no figure pattern is arranged, includes a region in contact with the figure pattern.

3. The apparatus according to claim 1, wherein a region not in contact with the figure pattern serves as the no-pattern forming region, which surrounds the whole perimeter of the figure pattern and in which no figure pattern is arranged, and a beam with the second dose irradiates the region not in contact with the figure pattern serving as the no-pattern forming region.

4. The apparatus according to claim 3, wherein a reduced pattern obtained by reducing a reversed pattern, which is generated by reversing the figure pattern and a part in which no figure pattern is arranged, is written in the no-pattern forming region.

5. The apparatus according to claim 1, further comprising a dose coefficient calculation unit configured to
calculate a first dose coefficient for calculating an incident dose that resolves the resist, for a first beam of the multiple beams which is corresponding to the pattern forming region, in which the figure pattern is arranged, and
calculate a second dose coefficient for calculating an incident dose that does not resolve the resist, for a second beam of the multiple beams which is corresponding to the no-pattern forming region, which surrounds the whole perimeter of the figure pattern and in which no figure pattern is arranged.

6. The apparatus according to claim 1, further comprising:
a pattern density calculation unit configured to calculate a pattern density, for each mesh region of a plurality of mesh regions obtained by virtually dividing a writing region into the plurality of mesh regions by a predetermined size;
a storage unit configured to store a relational equation between a coefficient, which is used for a dose calculation equation for calculating the second dose and is variable depending on a pattern density, and the pattern density; and
a coefficient calculation unit configured to read the relational equation from the storage unit and calculate the coefficient by using a value of the pattern density, for the each mesh region.

7. A multi charged particle beam writing method comprising:
calculating a first dose that resolves a resist on a target object, for a beam of multiple beams which is corresponding to a pattern forming region, in which a figure pattern is arranged, the multiple beams being formed by portions of a charged particle beam respectively passing through a corresponding opening of a plurality of openings;
calculating a second dose that does not resolve the resist, for a beam of the multiple beams which is corresponding to a no-pattern forming region, which surrounds a whole perimeter of the figure pattern and in which no figure pattern is arranged;
writing the pattern forming region, in which the figure pattern is arranged, by a irradiating a first beam on the target object, the first beam irradiated for the first dose and resolves the resist; and
writing the no-pattern forming region, which surrounds the whole perimeter of the figure pattern and in which no figure pattern is arranged, by a irradiating a second beam on the target object, the second beam irradiated for the second dose and does not resolve the resist,
wherein the first dose is calculated by using the second dose and the second dose is calculated by using the first dose.

8. The method according to claim 7, wherein the no-pattern forming region, which surrounds the whole perimeter of the figure pattern and in which no figure pattern is arranged, includes a region in contact with the figure pattern.

9. The method according to claim 7, wherein a region not in contact with the figure pattern serves as the no-pattern forming region, which surrounds the whole perimeter of the figure pattern and in which no figure pattern is arranged, and a beam with the second dose irradiates the region not in contact with the figure pattern serving as the no-pattern forming region.

10. The method according to claim 9, wherein a reduced pattern obtained by reducing a reversed pattern, which is generated by reversing the figure pattern and a part in which no figure pattern is arranged, is written in the no-pattern forming region.

11. The method according to claim 7, further comprising:
calculating a first dose coefficient for calculating an incident dose that resolves the resist, for a beam of the multiple beams which is corresponding to the pattern forming region, in which the figure pattern is arranged; and
calculating a second dose coefficient for calculating an incident dose that does not resolve the resist, for a beam of the multiple beams which is corresponding to the no-pattern forming region, which surrounds the whole perimeter of the figure pattern and in which no figure pattern is arranged.

12. The method according to claim 7, further comprising:

calculating a pattern density, for each mesh region of a plurality of mesh regions obtained by virtually dividing a writing region into the plurality of mesh regions by a predetermined size; and reading a relational equation from a storage unit that stores the relational equation between a coefficient, which is used for a dose calculation equation for calculating the second dose and is variable depending on a pattern density, and the pattern density, and calculating the coefficient by using a value of the pattern density, for the each mesh region.

13. The apparatus according to claim 1, further comprising:

a coefficient calculation unit configured to calculate a coefficient, which is used for a dose calculation equation for calculating the second dose, for the each mesh region.

* * * * *